US008719765B2

(12) United States Patent  
Cao et al.

(10) Patent No.: US 8,719,765 B2  
(45) Date of Patent: May 6, 2014

(54) DUAL-PATTERN COLORING TECHNIQUE FOR MASK DESIGN

(71) Applicant: Cadence Design Systems, Inc., San Jose, CA (US)

(72) Inventors: Min Cao, San Ramon, CA (US); Jeffrey Markham, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/797,788

(22) Filed: Mar. 12, 2013

(65) Prior Publication Data

US 2013/0191793 A1    Jul. 25, 2013

Related U.S. Application Data

(62) Division of application No. 13/087,324, filed on Apr. 14, 2011, now Pat. No. 8,429,574.

(51) Int. Cl.
    *G06F 17/50*    (2006.01)
(52) U.S. Cl.
    USPC ............... 716/139; 716/52; 716/54; 716/55; 716/112
(58) Field of Classification Search
    USPC .................... 716/112, 139, 52, 54–55
    See application file for complete search history.

(56) References Cited

U.S. PATENT DOCUMENTS

| | | | |
|---|---|---|---|
| 6,470,489 B1 | 10/2002 | Chang et al. | |
| 6,539,521 B1 | 3/2003 | Pierrat et al. | |
| 6,569,583 B2 | 5/2003 | Cho et al. | |
| 6,606,735 B1* | 8/2003 | Richardson et al. | 716/112 |
| 7,155,689 B2* | 12/2006 | Pierrat et al. | 716/52 |
| 7,172,838 B2 | 2/2007 | Maurer et al. | |
| 7,305,651 B2 | 12/2007 | Cao | |
| 7,310,797 B2 | 12/2007 | Huckabay | |
| 7,475,380 B2 | 1/2009 | Liebmann et al. | |
| 7,653,892 B1* | 1/2010 | Gennari et al. | 716/50 |
| 7,802,226 B2 | 9/2010 | Park et al. | |
| 7,865,865 B2 | 1/2011 | Socha | |
| 8,375,348 B1* | 2/2013 | Raj et al. | 716/126 |
| 8,429,574 B2* | 4/2013 | Cao et al. | 716/54 |
| 8,448,100 B1* | 5/2013 | Lin et al. | 716/54 |
| 2008/0166639 A1* | 7/2008 | Park et al. | 430/5 |
| 2008/0235645 A1* | 9/2008 | Kahng et al. | 716/11 |
| 2008/0307381 A1* | 12/2008 | Tritchkov et al. | 716/11 |
| 2009/0125866 A1 | 5/2009 | Wang et al. | |
| 2009/0217224 A1 | 8/2009 | Wiaux et al. | |
| 2010/0229145 A1* | 9/2010 | Sahouria et al. | 716/19 |
| 2011/0113393 A1 | 5/2011 | Sezginer | |
| 2011/0219341 A1 | 9/2011 | Cao et al. | |
| 2013/0074024 A1* | 3/2013 | Chase et al. | 716/112 |

* cited by examiner

*Primary Examiner* — Naum Levin  
(74) *Attorney, Agent, or Firm* — Kenyon & Kenyon LLP

(57) ABSTRACT

A hierarchical schematic design editor displays mask layers for each shape as mask specific colors and alerts a user to mask layer conflicts during the design and editing process. According to an embodiment, mask colors may be assigned at the time the shapes or geometries and cells are placed in a circuit design layout, or when a mask layer condition indicating that two or more shapes should be set to different mask layers is detected. In an embodiment, if the distance between two shapes is less than a predetermined threshold, those shapes may cause a mask layer condition. Shapes may be grouped to facilitate mask layer condition detection and mask layer assignment.

18 Claims, 10 Drawing Sheets

100

200

DUAL-PATTERN COLORING TECHNIQUE FOR MASK DESIGN

RELATED APPLICATIONS

The present application is a divisional of the following U.S. application Ser. No. 13/087,324 filed Apr. 14, 2011, now U.S. Pat. No. 8,429,574. The contents of the above referenced application and patent are incorporated herein by reference.

FIELD

Aspects of the present invention relate generally to the field of integrated circuit design, and more specifically to dual pattern mask design.

BACKGROUND

Integrated circuit design is increasingly complex, sometimes involving millions of shapes or geometries etched into a thin layer using photolithography. Thus the size of each shape, and the distance between shapes is constantly decreasing. Often, common configurations of shapes are grouped for convenience into a cell, such that a cell can be placed in the layout without requiring a recreation of each element or shape in the cell. A cell grouping may include multiple cells or a cell and additional shapes, creating a hierarchical design.

Dual patterning techniques are implemented to accommodate densely packed shapes. Shapes placed close together may be implemented on separate mask layers, or with a mask otherwise prepared differently for each of the two closely arranged shapes, allowing the shapes to be placed more closely together. Dual patterning techniques for mask design conventionally assign a "color" to each shape where the color represents the mask that will be used to implement the shape in the design. Where shapes are assigned a color, and two shapes of the same color are detected close together, the color of one shape is changed to a second color, representing a second mask.

Colors are conventionally assigned in batches, often at the end of the design process, as part of the finalization or verification of the design. In densely packed integrated circuits, color assignment can cause loops such that coloring for the desired layout cannot be achieved. Fixing the layout and coloring problem by that point often will involve significant re-work, redesign, retesting, and re-verification.

Accordingly, there is a need in the art for an efficient runtime assignment of mask colors that allows the user to visualize coloring assignments during layout design before finalization or verification.

BRIEF DESCRIPTION OF THE DRAWINGS

Various aspects of embodiments of the present invention will be apparent through examination of the following detailed description thereof in conjunction with the accompanying drawing figures in which similar reference numbers are used to indicate functionally similar elements.

DETAILED DESCRIPTION

An interactive process allows a user to visualize color conflicts early in the design process rather than waiting for verification. The interactive coloring process illustrates potential mask conflicts before a circuit design undergoes verification and finalization in order to avoid costly redesign necessitated by mask color assignment loops that can occur in densely packed designs. According to an embodiment, mask colors may be assigned at the time the shapes or geometries and cells are placed in a circuit design layout, thereby providing a mechanism for real-time mask consistent redesign. The mask coloring process may complement design hierarchies to develop efficient, run-time mask assignment.

Figure 1:
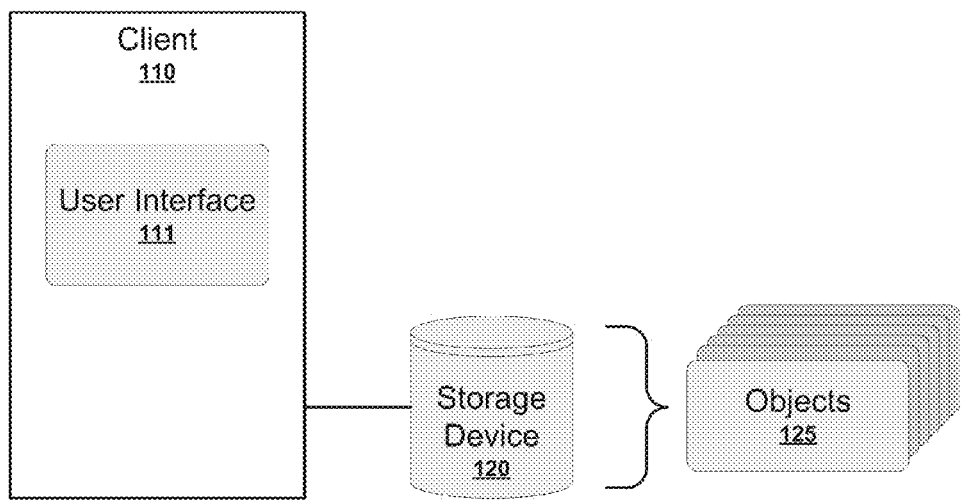
FIG. 1 is a block diagram illustrating components of an exemplary system according to an embodiment.

A user may access an integrated circuit design editor or other design layout tool having an interactive coloring technique in a standalone client system, client-server environment, or a networked environment. FIG. 1 is a block diagram illustrating components of an exemplary system 100 according to an embodiment. As shown in FIG. 1, a system 100 may comprise a client 110 having a user interface 111 and a memory storage device 120. Objects 125 representing a plurality of shapes, cells, pages or circuits, may be stored in the memory storage device 120. The client 110 may execute instructions stored on a computer readable medium, including a non-transitory computer readable medium, that facilitates access to the objects 125 stored in the memory storage device. According to an aspect of an embodiment, the instructions may be part of a software program or executable file that operates a circuit design editor. The client 110 may be any computing system that facilitates a user accessing a memory storage device 120 storing objects 125, for example a personal computer or processor.

According to an aspect of one embodiment, the plurality of objects 125 may be stored at the memory storage device 120 in a database. Then information about each object 125 may be stored in a record of the database including shapes implemented on a page to form a circuit and the connections between the shapes. The objects 125 may be stored such that a design stored in the memory storage device 120 may be persistent and retrieved and edited during different user initiated sessions. The objects 125 and related design data may then be retrieved by querying the database.

A user may access the objects 125 stored in the memory storage device 120 with the client 110 via a user interface 111 capable of accessing the memory storage device 120 and displaying the objects 125 and related circuit design data stored therein. The user interface 111 may be a program or application or may comprise middleware that acts as a frontend to and facilitates access to the memory storage device 120, for example, a schematic or circuit design editor or other design editing application. The user interface 111 may facilitate a real time display of information regarding the mask design and the interactive coloring technique described herein. The user may interact with the user interface 111 through a number of wired or wireless input devices, such as by making a selection with a mouse, trackpad, or other pointing device or inputting a request via a keyboard or touchscreen. The user may observe the response to the access request on an output device or display. The user interface 111 may run in an application window controlled by the user.

As shown in FIG. 1, a client 110 may be a stand-alone system, as may be of particular interest where the designs being developed are highly confidential. Additionally, according to an aspect of an embodiment as shown in FIG. 2, a client 210 may be part of a networked environment.

Figure 2:
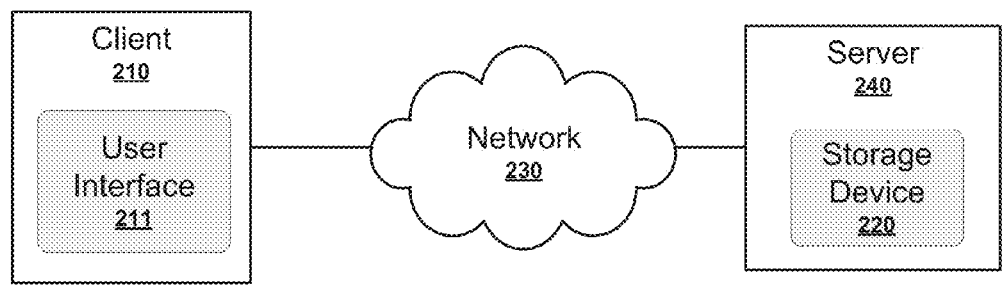
FIG. 2 is a block diagram illustrating components of an exemplary system according to an embodiment.

FIG. 2 is a block diagram illustrating components of an exemplary system 200 according to an embodiment. As shown in FIG. 2, system 200 may comprise a client 210 having a user interface 211. The client 210 may be connected to a server 240 via a network 230. A user may access objects stored in the memory storage device 220 with the client 210 having a user interface 211 capable of accessing and displaying the stored objects. The client 210 may be any computing system that facilitates the user accessing the memory storage device 220, for example a personal computer. The network 230 may be a wired or wireless network that may include a local area network (LAN), a wireless area network (WAN), the Internet, or any other network available for accessing the memory storage device 220 from the client 210.

The server 240 may be a network server accessible to the client 210 via the network 230 that may manage access to the memory storage device 230. The user interface 211 may receive from the user instructions regarding the design of a circuit or other feature and with the objects stored in the memory storage device 220, facilitate a real time display of information regarding the mask design and the interactive coloring technique described herein. Multiple different clients (not shown) may access the memory storage device 220 via the network 230 and request access to the objects stored therein.

Figure 3:
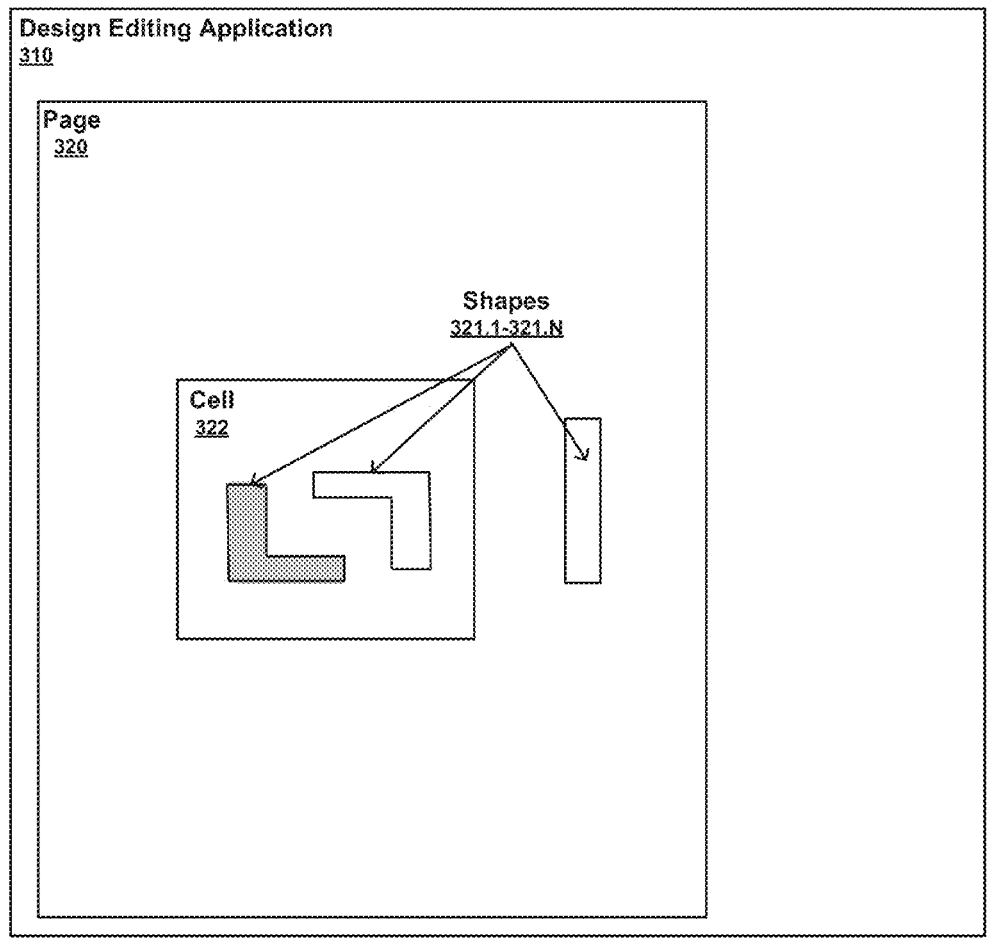
FIG. 3 illustrates an exemplary schematic editor that implements an interactive coloring technique according to an embodiment.

FIG. 3 illustrates an exemplary schematic editor or circuit design and layout tool that implements an interactive coloring technique according to an embodiment. Design editing application 310 may include at least one page 320 upon which a circuit may be designed or a schematic may be edited. Shapes 321, cells 322, or other components may then be placed on the page 320 as part of the circuit design. Multiple shapes 321 or cells 322 may be placed on one or more pages 320 to design a complete circuit.

Commonly used shape layouts and combinations may be combined into a cell 322 to make circuit design more efficient. The mask colors for the shapes in the cell 322 may be set such that the placement of a copy of the cell 322 on a page 320 maintains the assigned colors and displays those colors in the design editing application 310 display.

Figure 4:
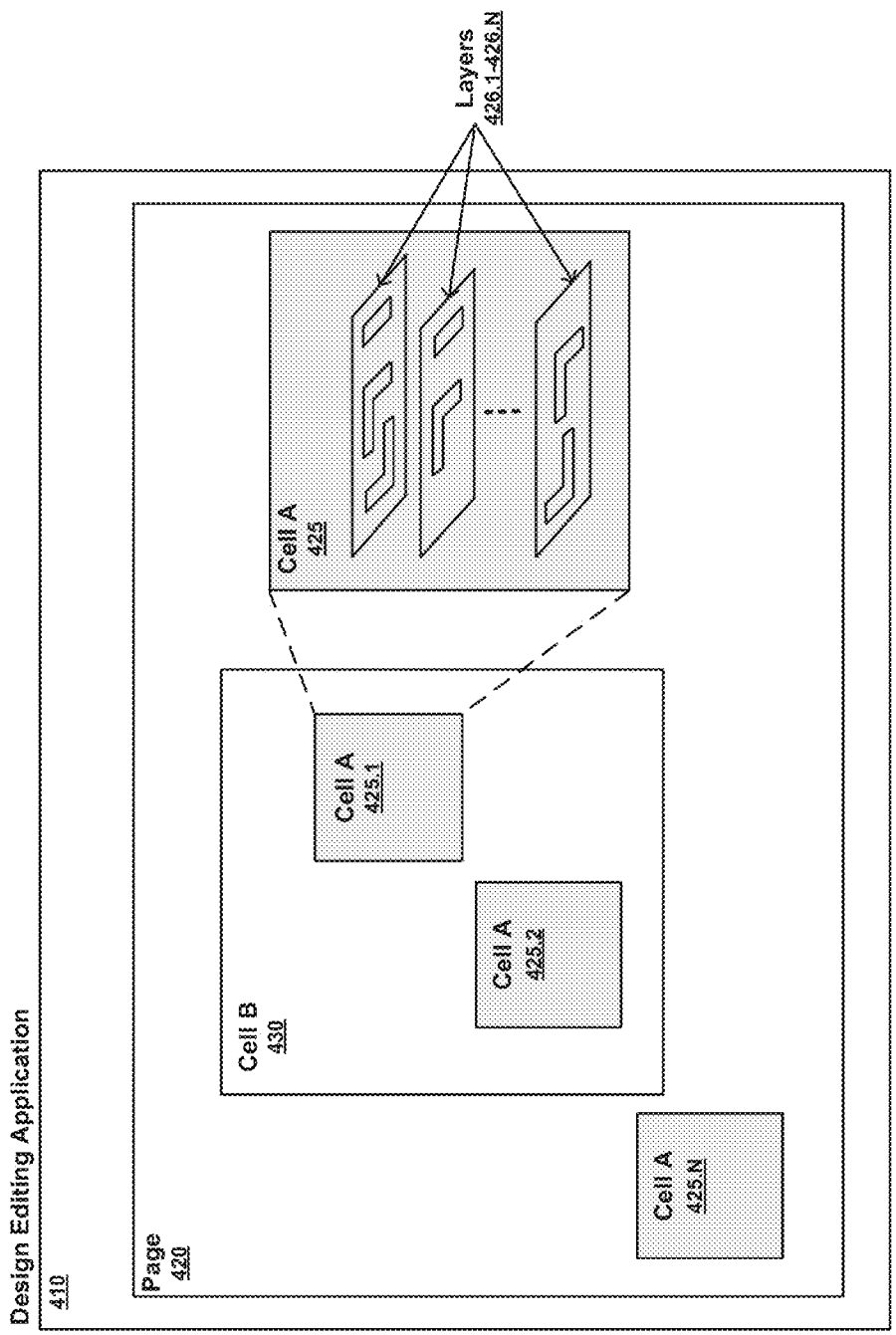
FIG. 4 illustrates an exemplary schematic editor that implements an interactive coloring technique according to an embodiment.

FIG. 4 illustrates an exemplary schematic editor or circuit design and layout tool that implements an interactive coloring technique according to an embodiment. As shown in FIG. 4, in a design editing application 410, a combination of shapes may be collected into a cell. Cell A 425 consists of several shapes organized into layers 426.1-426.N for masks. Multiple instances of cell A 425, 425.1-425.N, may then be placed on page 420 such that each layer and shape is placed on the page 420 in the desired layout in a single step, thereby making the design more efficient. As shown, a cell may include other cells. For example, cell B 430 comprises multiple instances 425.1, 425.2 of cell A, thereby creating a hierarchy of the cells and shapes. In FIG. 4, cell B 430 is on a higher hierarchy level than cell A 425.1 and cell A 425.2.

Figure 5:
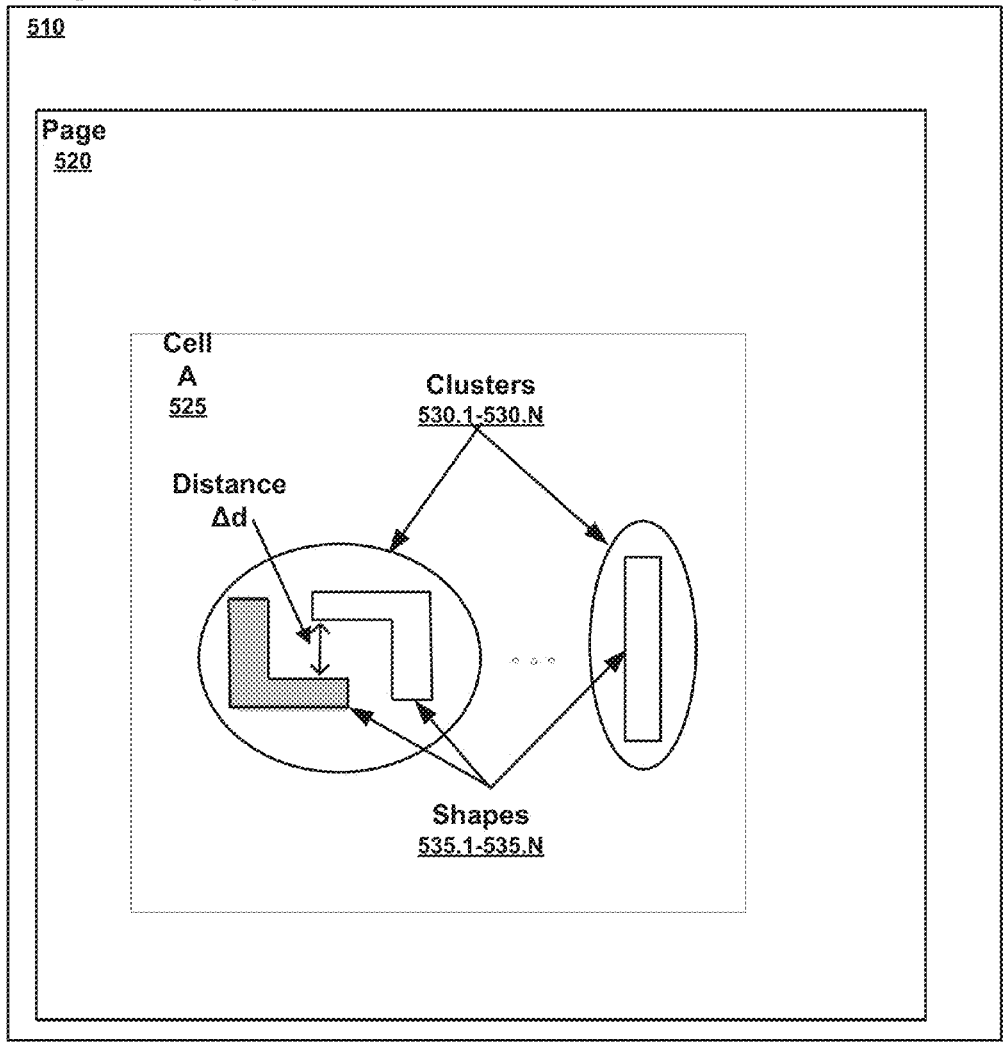
FIG. 5 illustrates an exemplary schematic editor that implements an interactive coloring technique according to an embodiment.

FIG. 5 illustrates an exemplary schematic editor or circuit design and layout tool that implements an interactive coloring technique according to an embodiment. In an exemplary design editing application 510, multiple cells and shapes may be placed on a page 520. Layout design rules may be implemented with the design editing application 510 to facilitate interactive editing of dual patterned designs. For example, two shapes placed on page 520 may be considered adjacent if the distance ($\Delta d$) between the two shapes is less than a predetermined minimum distance. The predetermined minimum distance may represent the threshold minimum distance between shapes implemented with a single same mask. If shapes 535 are placed together more closely than the minimum distance, the shapes 535 may be implemented on multiple masks. Shapes that are within the minimum distance may be identified to the user, indicating that the shapes will be implemented with multiple masks. Adjacent shapes may then be grouped into clusters. Shapes may be clustered and assigned to different mask layers for various reasons. As described herein, shapes are placed on different layers when they are placed within the minimum distance in the layout; however, it may be desired to separate the shapes of a layout onto different layers upon detection of different conditions.

A cluster 530 may be a collection of shapes grouped to facilitate coloring for dual pattern layout design. According to an aspect of an embodiment, a cluster may be defined according to a plurality of design rules. For example, a shape that is adjacent to one or more shapes in a cluster belongs to that cluster. Accordingly, a shape that belongs to a cluster is adjacent to one or more other shapes in the cluster. A shape that is not adjacent to any shape in the layout belongs to a cluster that only contains itself. And when a shape is added, moved or deleted from the page, the clustering should be maintained, such that each shape and cell meets the cluster design rules.

Figure 6:
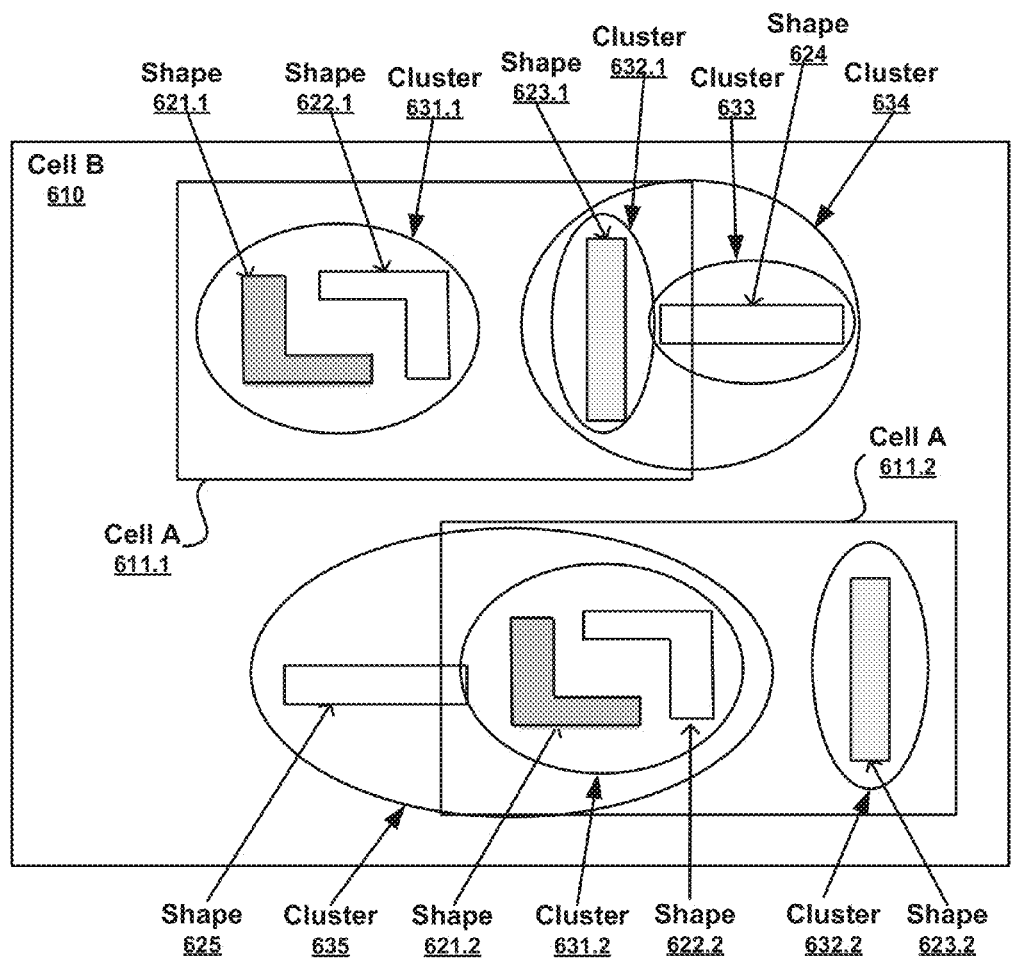
FIG. 6 illustrates an exemplary schematic editor that implements clustering with an interactive coloring technique according to an embodiment

FIG. 6 illustrates an exemplary schematic editor that implements clustering with an interactive coloring technique according to an embodiment. When a shape or cell is inserted into a page, adjacent shapes may be added to one of the existing clusters of the page, or cause existing clusters to merge. As shown in FIG. 6, cell B 610 may consist of multiple shapes 621-625, cells 611, and clusters 631-634. Where cell B 610 initially consists of shape 624, and shape 624 is not adjacent to any other shape, shape 624 may be part of a cluster 633 that consists of the single shape. Then cell A 611.1 may be added to the parent cell B 610. Then where cell A 611.1 consists of shapes 621.1, 622.1, and 623.1 grouped into clusters 631.1 and 632.1, and the addition of cell A 611.1 causes two shapes, 623.1 and 624, to be adjacent, a new cluster 634 may be formed. As shown, this new cluster 634 may contain shapes from both in a cell, e.g. 623.1 and from outside the cell, e.g. 624.

In another example of forming clusters, where cell 610 consists of cell A 611.2, and cell A 611.2 includes shapes 621.2, 622.2 and 623.2 and clusters 631.2 and 632.2, then a shape 625 may be added to cell B 610. The addition of shape 625 may cause two shapes, 621.2 and 625, to be adjacent, then a new cluster 635 may be formed. As shown, this new cluster

634 may contain shapes from both in a cell, e.g. 621.2 and from outside the cell, e.g. 625.

As shown in FIG. 6, shapes 621-623 of cell A 611 and clusters 631-632 are part of, and may be stored as, a first hierarchy level. Shapes 624-625, along with cells 611.1 and 611.2 and clusters 633-635, are part of, and may be stored as, a second hierarchy level.

Figure 7A:
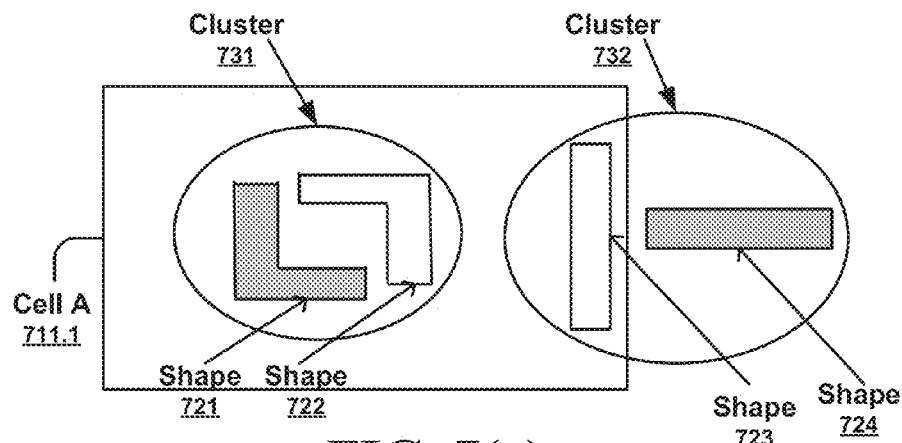
FIGS. 7(a)-7(c) illustrate exemplary interactive coloring of shapes in a cluster.
Figure 7B:
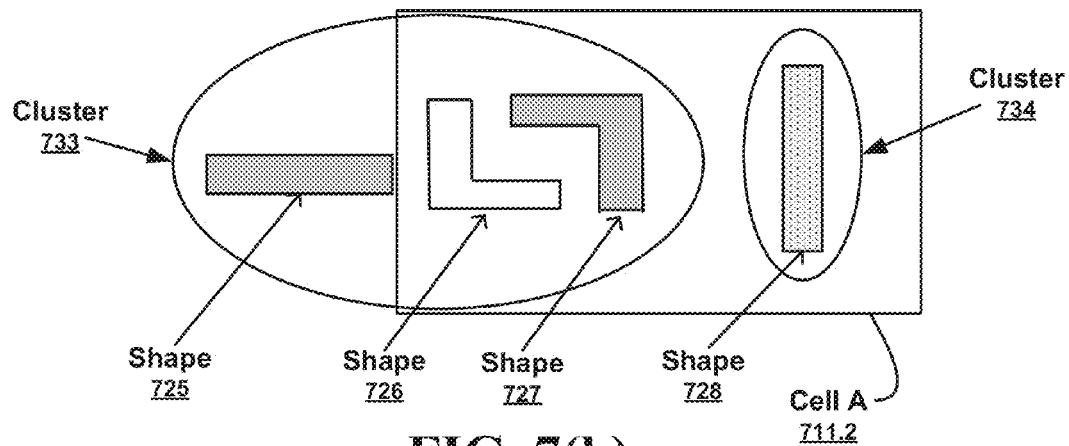
Figure 7C:
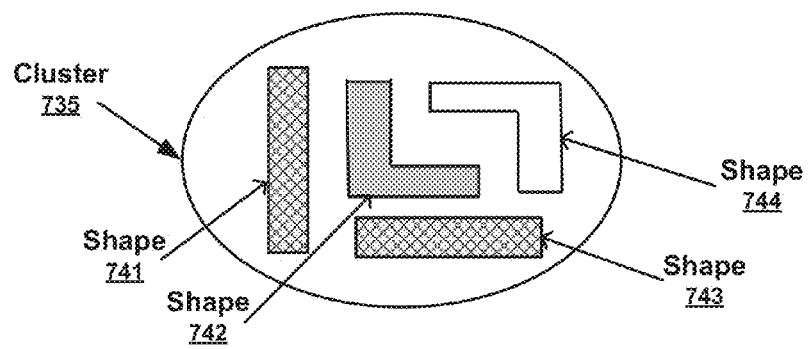

When a cluster is formed or edited, the mask colors for shapes in the cluster may be determined. FIGS. 7(*a*)-7(*c*) illustrate exemplary interactive coloring of shapes in a cluster. When a cluster is created, a shape is added to an existing cluster of a page, or other additions or changes to a cluster are made, the color for the shapes of the cluster may be determined and displayed. Shapes that were already part of a cluster may already have an assigned color. Then the addition of a new shape to the cluster may cause the new shape to be assigned a color consistent with the assigned colors for the other shapes in the cluster. For example, as shown in FIG. 7(*a*), the shapes of cell A 711.1 may already be assigned colors. Then, adding shape 724 on the page, adjacent to shape 723 may create a new cluster 732. During the creation of new cluster 732, the mask colors for the shapes in cluster 732 may be determined by setting the color of shape 724 with respect to the color of shape 723. If the shapes are implemented in a dual pattern system, color assignment may be achieved by flipping the color of a shape from one color to another based on the color of the adjacent shapes.

Alternatively, as shown in FIG. 7(*b*), the addition of an adjacent shape may cause all the shapes of a cell or cluster to flip. For example, in cell A 711.2 having shapes 726-728 with at least shapes 726 and 727 previously assigned a color, the addition of shape 725 adjacent to shape 726 to create cluster 733, may cause the color of shape 726 to flip. Then the color of shape 727 may also be flipped.

A shape that is not adjacent to any other shape, e.g. shape 728, that shape 728 may be part of a cluster 734 that consists of the single shape. Then the shape 728 may be set to a default mask color or the shape 728 may be uncolored and a mask color may not be determined until the shape 728 is added to another cluster or is otherwise assigned a mask layer.

If the colors for the shapes in a cluster cannot be set, an indication may be presented to the user that the present layout has errors and that the color masks cannot be properly set. The design may then be altered to allow for appropriate color masks. For example, as shown in FIG. 7(*c*), shapes 741-744 in cluster 735 cannot be colored in a dual pattern technique with the current layout. In accordance with an aspect of an embodiment, the design editor may require the error inducing shape(s) be moved within the layout such that appropriate mask colors may be assigned. The error may be displayed with the mask color display or with some other notification that may allow the user to fix the layout error during run time rather than after a failed test or verification.

If the colors of the shapes are properly set, the mask color assigned to a shape, if any, may be displayed on the page such that the user can easily see the current mask color assignments. For example, a halo effect representing the color of the shapes may be displayed around the shapes. Alternately, some other highlighting or coloring of the shapes may be displayed on the page, or a list of the shapes and corresponding colors may be displayed in the design editing application. As shown in FIG. 7, shapes 721-722 of cluster 731, shapes 723-724 of cluster 732, and shapes 725-727 of cluster 733 have each been properly assigned a color.

Figure 8:
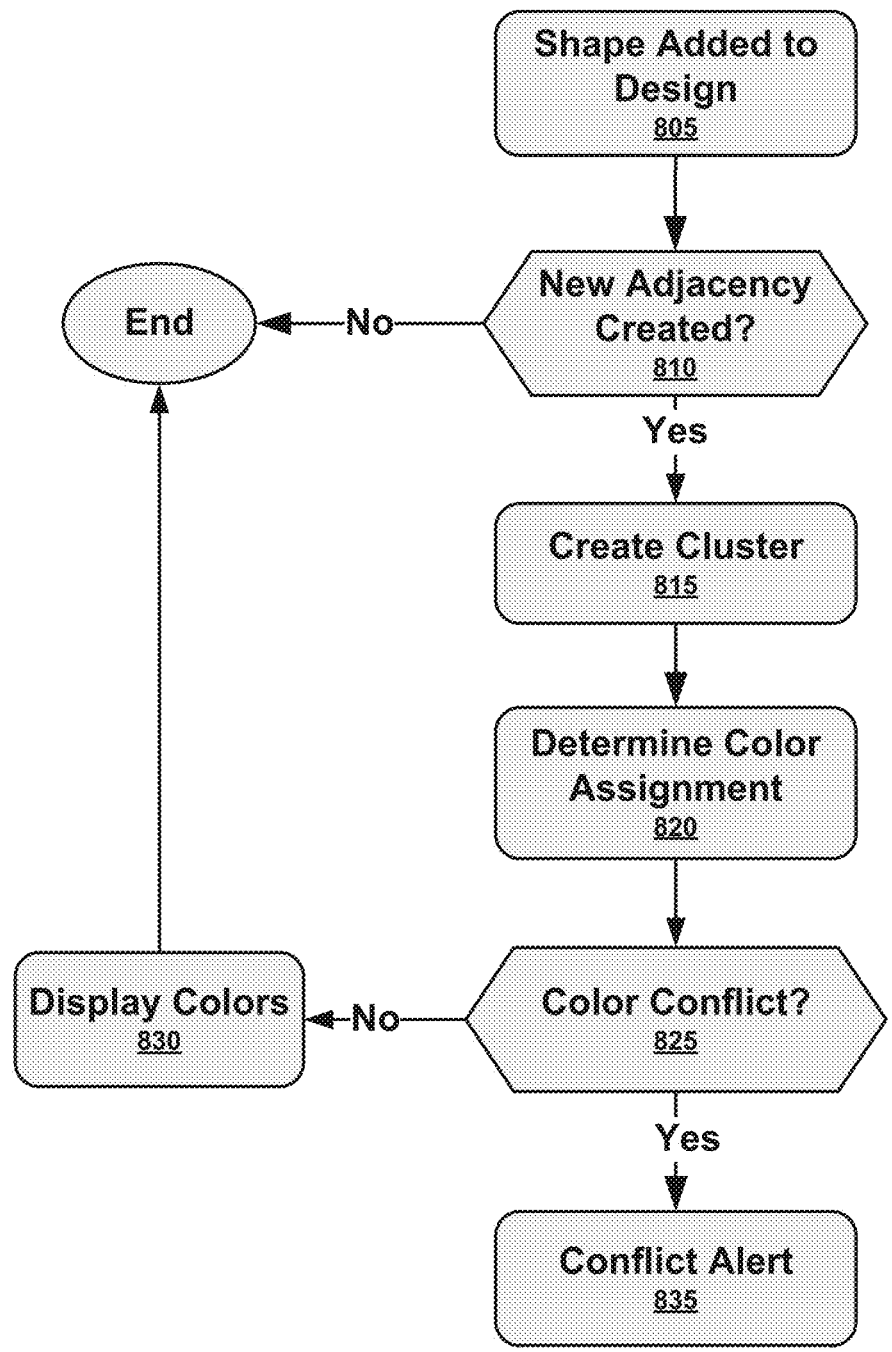
FIG. 8 is a simplified flow diagram illustrating a method for cluster creation with an interactive coloring technique according to an embodiment.

FIG. 8 is a simplified flow diagram illustrating a method for cluster creation with an interactive coloring technique according to an embodiment. As shown in FIG. 8, upon addition of a shape to a page in the design (block 805), the added shapes and the shapes neighboring the added shape may be examined to determine if a new adjacency was created (block 810). If no new adjacency was created then no mask color assignments need to be made to the shapes and the design editor may continue to wait for another addition or other design edit that creates a new adjacency. However, if a new adjacency was created (block 810), thereby creating a new mask layer condition, a new cluster may be created, the new cluster including the detected adjacent shapes and any additional shapes adjacent to those shapes (block 815). Then the assignment of colors to the shapes of the cluster may be determined (block 820). If no conflict in mask color assignment is detected (block 825), the colors of the shapes in the cluster may be set and displayed on the page (block 830). If a conflict in color assignment is detected (block 825), an error or conflict alert may be presented to the user (block 835).

Figure 9:
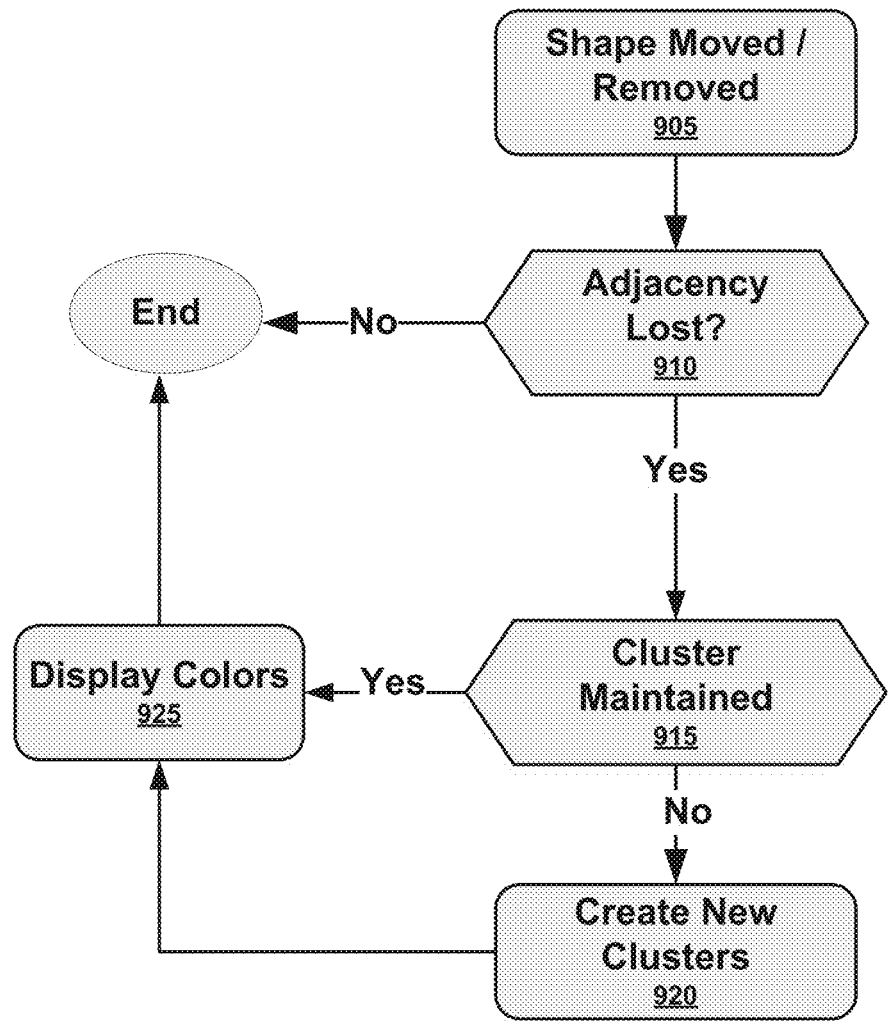
FIG. 9 is a simplified flow diagram illustrating a method for cluster management with an interactive coloring technique according to an embodiment.

Similarly, the coloring and clustering of shapes should be properly maintained when a shape is moved out of a cluster or deleted from a page altogether. FIG. 9 is a simplified flow diagram illustrating a method for cluster management with an interactive coloring technique according to an embodiment. As shown in FIG. 9, upon removal of a shape from a page, or otherwise being moved away from a previously adjacent shape (block 905), the affected shapes may be examined to determine if an adjacency was disrupted or lost (block 910). If an adjacency was not lost then no mask color assignment adjustments need to be made to the shapes and the design editing application may continue to wait for another layout edit that changes the membership or adjacencies of the cluster.

If an adjacency was lost (block 910), a cluster may have been disrupted (i.e. not maintained). If the cluster is not maintained (block 915), new clusters may be created (block 920) and the mask colors for the shapes in the new clusters may be determined, set, or reevaluated and displayed (block 925). If the cluster is maintained (block 915), no new clusters will be created. Removing a shape from a cluster may have no effect on the mask colors for the shapes remaining in the cluster, then the mask color assignment may persist and those mask colors may be displayed (block 925). However, even where no new clusters were created, if removing a shape from a cluster affects the mask color assignments for the shapes remaining in the cluster, the mask colors for the shapes in the new clusters may be determined, set, or reevaluated and displayed (block 925).

Figure 10:
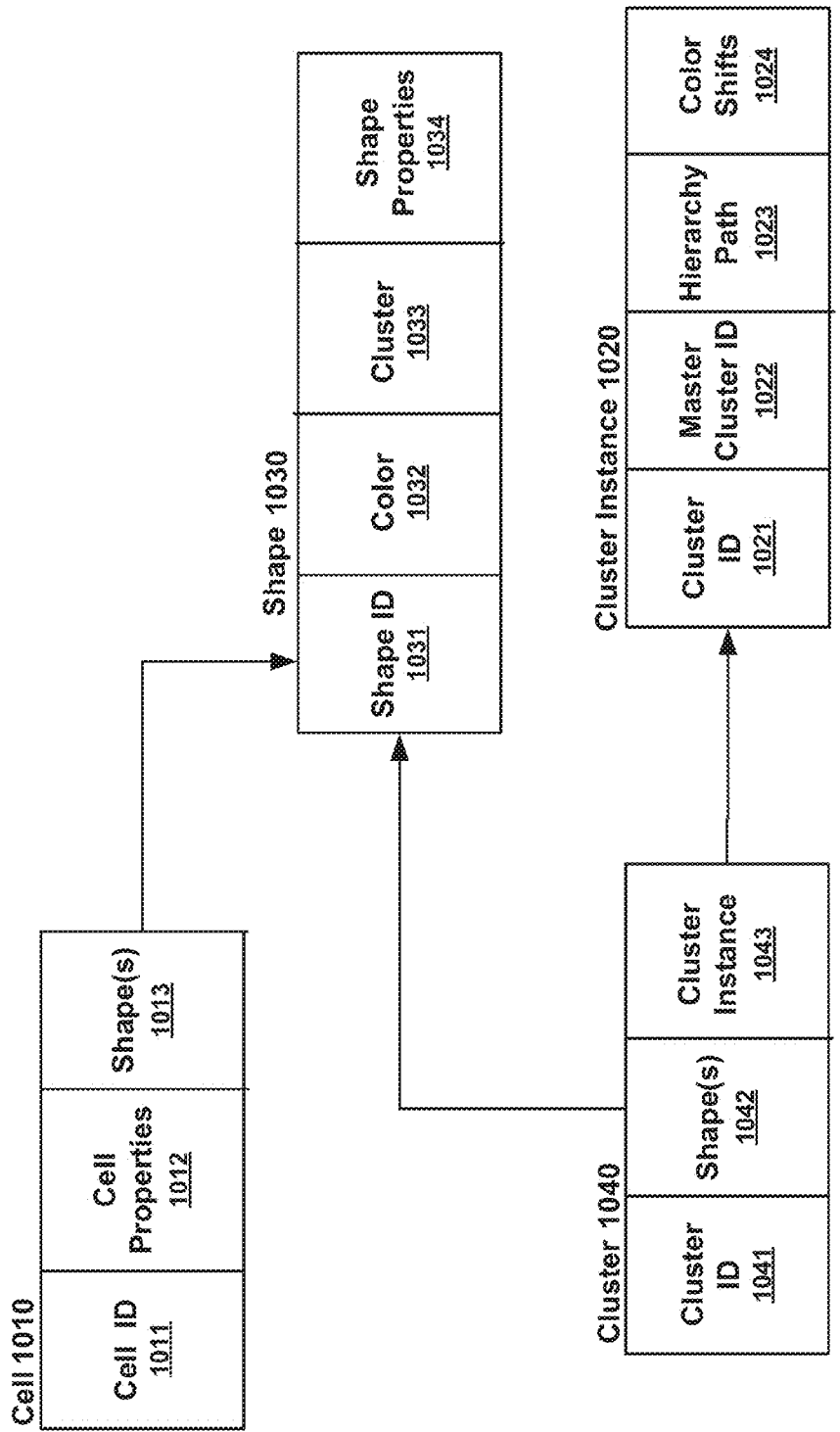
FIG. 10 illustrates exemplary records for implementing a cluster based hierarchy with an exemplary database according to an embodiment.

A database or other storage system may be implemented to manage design creation with an interactive coloring technique and to store schematic details for later editing. When a shape or cell is placed on a page of a schematic, a record for the shape or cell may be created in a database. FIG. 10 illustrates exemplary records for implementing a cluster based hierarchy with an exemplary database according to an embodiment.

As shown in FIG. 10, a cell record 1010 may contain a cell ID 1011, the properties of the cell 1012, and the identities of the shapes of the cell 1013. The cell ID 1011 may be an identifier of the cell unique to the page, such that all the information relevant to the specific instance of the cell may be associated with the unique ID. The cell properties 1012 may contain other information relevant to the cell as a whole. The shapes pointers 1013 may point to instances of the shapes that comprise the cell.

A cluster instance record 1020 may include a cluster ID 1021, a master cluster ID 1022, a hierarchy path 1023, and a count of any full cluster color shifts for the cluster 1024. The cluster ID 1021 may be an identifier unique to the page, such that all the information relevant to the specific instance of the cluster may be associated with the unique ID. The master cluster ID 1022 may be a master cluster identifier unique to the page such that all information relevant to each instance of the cluster may be associated with the unique ID.

The hierarchy path 1023 for a cluster instance may include pointers to other cells in the hierarchy path and may be stored with the cluster instance record 1020 in the database. A hierarchy path 1023 may include the cells in the hierarchy (parent and child cells) for the cluster instance. The hierarchy path 1023 for a cluster may be stored only once for the page, at the hierarchy level that contains the cluster.

In an aspect of an embodiment, cluster information may be stored in a master cluster record 1040 and instance specific cluster information in a cluster instance record 1020, then retrieval of cluster instance information may be facilitated with a lookup table including a cluster instance ID 1021 and master cluster ID 1022 for each cluster in a cell. Then a lookup of the known master cluster ID 1022 may facilitate retrieval of the cluster instance 1020 information.

The count of color shifts 1024 may be stored as part of the cluster instance and may indicate that the color for each shape in the cluster should be 'flipped'. The count of color shifts 1024 for the cluster may be incremented according to the environment surrounding the cluster. For example, returning to embodiment illustrated in FIG. 6, when a shape 625 of a first mask is placed adjacent to another shape 621.2 of the first mask from an existing cluster 631.2, the color of every shape in the existing cluster 631.2 may be flipped to accommodate the mask color of the added shape 625. An even count for the full cluster color flip may indicate that the colors of the shapes in the cluster should not be flipped (as they would be flipped an even number of times) whereas an odd count may indicate that the colors of each shape should be flipped once.

A cluster record 1040 may include a cluster ID 1041, the identities of the shapes of the cluster 1042, and a cluster instance 1043. The cluster ID 1041 may be a specific identifier unique to the page, such that all the information relevant to each instance of the cluster may be associated with the unique ID. The shapes pointers 1042 may point to instances of the shapes that comprise the cluster. The cluster instance 1043 may be a cluster instance identifier unique to the page that identifies each instance of the cluster. A cluster instance 1020 may be a hierarchical reference of a cluster 1040.

A shape record 1030 may contain a shape ID 1031, the color of the shape 1032, the identity of the cluster containing the shape 1033, and the shape properties 1034. The shape ID 1031 may be an identifier unique to the cell or page, such that all the information relevant to the specific instance of the shape in the cell or page may be associated with the unique ID. The shape color 1032 may reflect the mask color or mask layer that the specific instance of the shape is currently assigned. A dual pattern design may be limited to only two colors or layers, but according to an aspect of an embodiment, additional colors and layers may be implemented. The cluster pointer 1033 may point to instance of the cluster that contains the shape. The cluster pointer 1033 may point only to the lowest level cluster. The higher level clusters may then be identified with reference to the hierarchy path of the identified cluster. The shape properties 1034 may contain other information relevant to the shape.

To display the color for shapes in a page, the color of a shape may be determined by querying the database for the shape record 1030. Then a total color flip count for the shape's associated cluster(s) may be determined. If it is determined that the parent cluster 1020 of the shape has a count of color shifts 1024 indicating that the color of every shape in that cluster should be flipped, the total flip count for the shape will be adjusted accordingly. Any parent clusters of that cluster may then be evaluated to determine the count of color shifts 1024 and so on until all clusters for which that shape belongs have been evaluated and the total flip count for the shape has been set. For example, returning to the embodiment illustrated in FIG. 6, the color of shape 621.2 may be determined by querying the associated database record 1030. Then the count of color shifts 1024 for parent cluster 631.2 may be determined by querying the cluster record and the count of color shifts 1024 may be added to the total color flip count for the shape. The cluster 631.2 may have cluster 635 in the hierarchy path, indicating that cluster 635 is a parent to cluster 631.2. Then the count of color shifts 1024 for cluster 635 may be determined, and may be added to the total color flip count for the shape, resulting in a total color flip count for the shape 621.2. An even number for the total flip count may indicate that the color of the shape 621.2 should not be flipped whereas an odd number may indicate that the color of the shape 621.2 should be flipped once.

Figure 11:
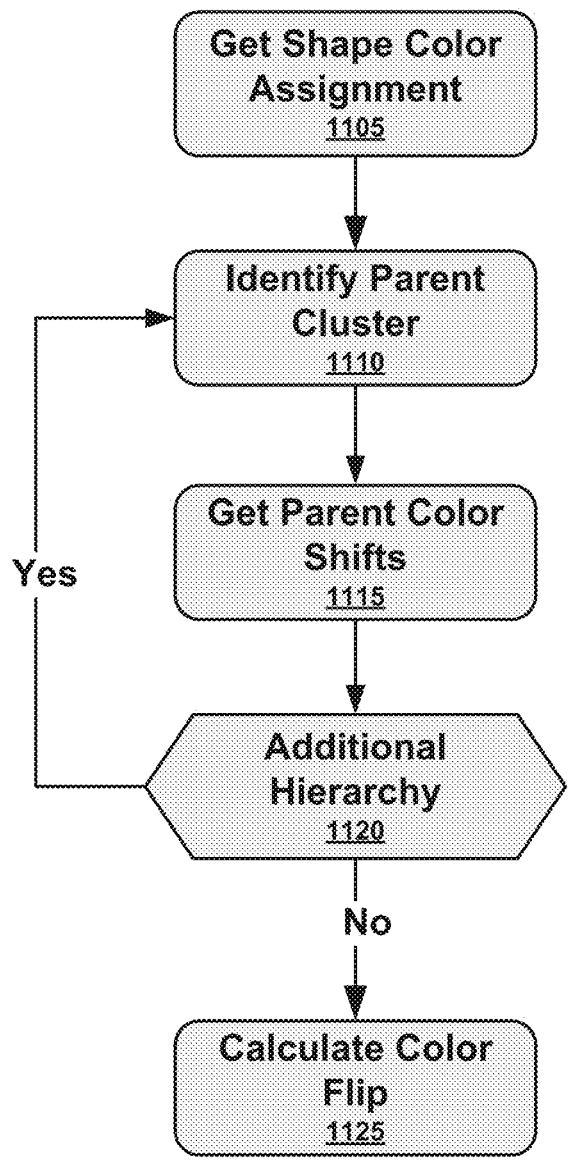
FIG. 11 is a simplified flow diagram illustrating a method for color determination with an interactive dual pattern coloring technique according to an embodiment.

FIG. 11 is a simplified flow diagram illustrating a method for color determination with an interactive dual pattern coloring technique according to an embodiment. As shown in FIG. 11, upon a request to display a mask color for a shape, the shape color assignment may be determined by querying a database for the shape instance record (block 1105). Then a total color flip count for the shape's associated cluster(s) may be determined by first identifying the shape's parent cluster (block 1110). The count of color shifts may be determined by querying the database for the parent cluster record (block 1115). The cluster's count of color shifts may then be added to the shape's total flip count. With the cluster record, the hierarchy path can be evaluated to determine if the cluster has any further parent clusters (block 1120). Any parent clusters of that cluster may then be evaluated to determine the count of color shifts and so on until all clusters for which that shape belongs have been evaluated and the total flip count for the shape has been set. Then the total color flip count for the shape may be evaluated to determine the color to display (block 1125). To determine shape mask color, if the total flip count is even, the shape may be displayed with the original shape color assigned. However, if the total flip count is odd, the color of the shape may be flipped and the shape may be displayed as a new color assignment.

Although the embodiments above have been described primarily with reference to dual pattern schematic design, aspects of embodiments of the invention may implemented with more than two masks or may be applicable to other design or manufacturing techniques that may utilize a clustered hierarchy. It is also noted that the arrangement of the blocks in FIGS. 8-9 do not necessarily imply a particular order or sequence of events, nor is it intended to exclude other possibilities. For example, the operations depicted at blocks 810 and 820 may occur substantially simultaneously with each other.

It also should be noted that embodiments of the present invention, when implemented in software, may be stored in a computer-readable medium, including a non-transitory computer readable medium. Such medium would be a tangible medium, such as an optical, magnetic, or magneto-optical removable medium, non-removable storage, or removable or non-removable semiconductor storage such as static random access memory (SRAM).

While embodiments of the present invention have been described in detail above, variations within the scope and spirit of the invention will be apparent to those of ordinary skill in the art. Thus, the invention should be considered as limited only by the scope of the appended claims.

What is claimed is:

1. A method for creating a schematic using a processor, the method comprising:
adding, with the processor a first plurality of shapes to the schematic;
maintaining with the processor a hierarchy for a plurality of cells and shapes added to the schematic;
detecting with the processor a mask layer condition for a second plurality of shapes during editing of the schematic, wherein the mask layer condition indicates that the second plurality of shapes should be assigned to different mask layers;
upon detection of the mask layer condition, assigning with the processor a mask layer to the second plurality of shapes; and
displaying on a display the mask layer for each affected shape when the mask layer is assigned.

2. The method of claim 1 wherein a mask layer condition is detected when a distance between two shapes is less than a predetermined threshold.

3. The method of claim 1 wherein the mask layer is displayed as a mask specific color.

4. The method of claim 1 further comprising:
displaying an alert upon detection of a mask layer conflict.

5. The method of claim 1 further comprising:
grouping a third plurality of shapes into a cluster;
wherein each shape in the cluster is within a predetermined minimum distance of at least one other shape in the cluster.

6. The method of claim 5 wherein the shapes of the cluster are from a plurality of hierarchy levels.

7. A non-transitory computer readable medium storing instructions that when executed by a processor perform a method for creating a schematic using a processor, the method comprising:
adding, with the processor a first plurality of shapes to the schematic;
maintaining with the processor a hierarchy for a plurality of cells and shapes added to the schematic;
detecting with the processor a mask layer condition for a second plurality of shapes during editing of the schematic, wherein the mask layer condition indicates that the second plurality of shapes should be assigned to different mask layers;
upon detection of the mask layer condition, assigning with the processor a mask layer to the second plurality of shapes; and
displaying on a display the mask layer for each affected shape when the mask layer is assigned.

8. The computer readable medium of claim 7, wherein a mask layer condition is detected when a distance between two shapes is less than a predetermined threshold.

9. The computer readable medium of claim 7, wherein the mask layer is displayed as a mask specific color.

10. The computer readable medium of claim 7, further comprising:
displaying an alert upon detection of a mask layer conflict.

11. The computer readable medium of claim 7, further comprising:
grouping a third plurality of shapes into a cluster;
wherein each shape in the cluster is within a predetermined minimum distance of at least one other shape in the cluster.

12. The computer readable medium of claim 11, wherein the shapes of the cluster are from a plurality of hierarchy levels.

13. A system for creating a schematic comprising:
a memory device for storing the schematic, shapes, and cells;
a processor configured to maintain a hierarchy of a first plurality shapes added to the schematic, to detect a mask layer condition for a second plurality of shapes during editing of the schematic, wherein the mask layer condition indicates that the second plurality of shapes should be assigned to different mask layers, and upon detection of the mask layer condition, to assign with the processor a mask layer to the second plurality of shapes; and
a display for displaying the mask layer for each affected shape when the mask layer is assigned.

14. The system of claim 13, wherein a mask layer condition is detected when a distance between two shapes is less than a predetermined threshold.

15. The system of claim 13, wherein the mask layer is displayed as a mask specific color.

16. The system of claim 13, further comprising:
displaying an alert upon detection of a mask layer conflict.

17. The system of claim 13, further comprising:
grouping a third plurality of shapes into a cluster;
wherein each shape in the cluster is within a predetermined minimum distance of at least one other shape in the cluster.

18. The system of claim 17, wherein the shapes of the cluster are from a plurality of hierarchy levels.

* * * * *